(12) United States Patent
Auer et al.

(10) Patent No.: US 6,373,296 B1
(45) Date of Patent: Apr. 16, 2002

(54) CIRCUIT CONFIGURATION FOR DRIVING A SEMICONDUCTOR SWITCH

(75) Inventors: Frank Auer, Röhrmoos; Wolfgang Horchler, Rosenheim; Michael Lenz, Zorneding, all of (DE)

(73) Assignee: Infineon Technologies A.G., Munich (DE)

( * ) Notice: Subject to any disclaimer, the term of this patent is extended or adjusted under 35 U.S.C. 154(b) by 0 days.

(21) Appl. No.: 09/566,931

(22) Filed: May 8, 2000

(30) Foreign Application Priority Data

May 7, 1999 (DE) .......................... 199 21 112

(51) Int. Cl.⁷ .............................. H03B 1/00; H03K 3/00
(52) U.S. Cl. ...................... 327/108; 327/109; 327/512; 327/376; 327/377
(58) Field of Search .................... 327/108–112, 427, 327/434, 437, 484, 512, 376, 374, 377

(56) References Cited

U.S. PATENT DOCUMENTS

| | | | | |
|---|---|---|---|---|
| 4,791,326 A | * | 12/1988 | Vajdic et al. ............... | 327/437 |
| 4,888,559 A | * | 12/1989 | Sevenhans et al. .......... | 330/253 |
| 5,557,223 A | * | 9/1996 | Kuo ........................... | 327/427 |
| 5,625,306 A | * | 4/1997 | Tada .......................... | 327/112 |
| 5,754,078 A | * | 5/1998 | Tamagawa ................... | 330/255 |
| 6,037,811 A | * | 3/2000 | Ozguc ........................ | 327/108 |

\* cited by examiner

Primary Examiner—Toan Tran
Assistant Examiner—Long Nguyen
(74) Attorney, Agent, or Firm—Herbert L. Lerner; Laurence A. Greenberg; Werner H. Stemer

(57) ABSTRACT

The circuit configuration has a semiconductor switch and a driver circuit that drives the switch. A switching signal is applied at an input terminal of the driver circuit and an output terminal that is connected to a control input of the semiconductor switch outputs a drive signal. The drive signal depends on the switching signal and its gradient during a change from a first drive level to a second drive level is temperature-dependent.

18 Claims, 3 Drawing Sheets

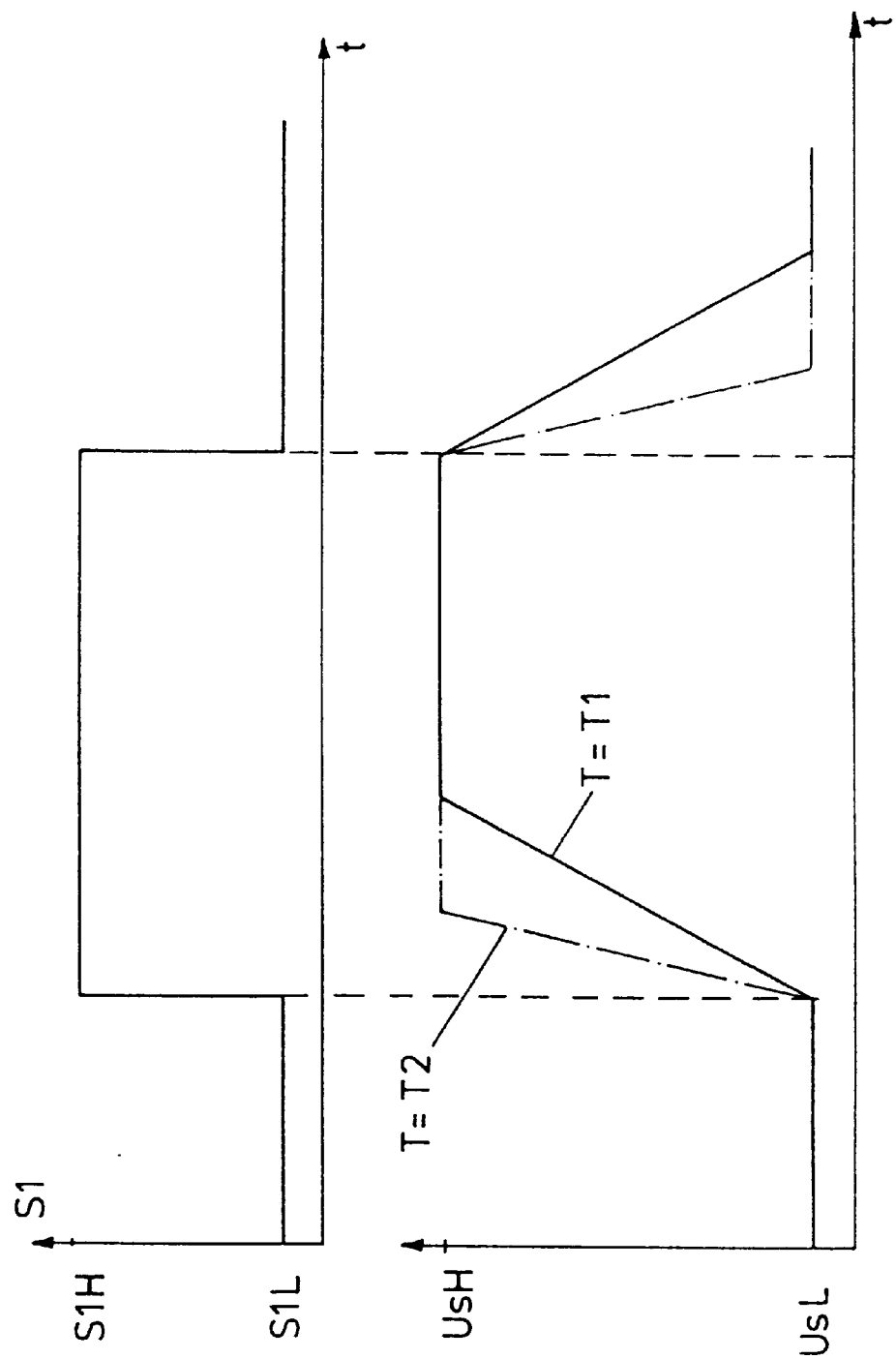

CIRCUIT CONFIGURATION FOR DRIVING A SEMICONDUCTOR SWITCH

BACKGROUND OF THE INVENTION

FIELD OF THE INVENTION

The present invention relates to a circuit configuration having a semiconductor switch and a driver circuit, which has an input terminal for applying a switching signal and an output terminal. The output is connected to a control input of the semiconductor switch, for supplying a drive signal on the basis of the switching signal.

Such circuit configurations are used to switch currents, for example in switched-mode power supplies, bridge circuits or, generally, to connect a load connected in series with the load path of the semiconductor switch to a supply voltage. In this context, the circuit configurations are able to switch relatively high currents or voltages with short switching times. Electromagnetic radiation caused by the switching process and radiated by the circuit has more energy and a higher frequency, and thus causes more interference, the faster the semiconductor switch is driven, that is to say the switch changes over from the on to the off state or from the off to the on state.

A drive signal which is provided for driving the semiconductor switch and is supplied to the control input of the semiconductor switch assumes one of two drive levels, depending on whether the semiconductor switch is intended to be on or off. To limit the interference radiation, the known circuit configurations usually have driver circuits in which the gradient of the edges of the drive signals, and hence the gradient of the edges of the output signal from the semiconductor switch, are limited during the change from one drive level to the other. During the switching process, losses arise on the semiconductor switch which are particularly high if as when inductive loads are driven in bridge circuits—high currents flow through the semiconductor switch during changeover. The electrical power which is then converted into heat on the semiconductor switch rises as the switching frequency increases, and can cause significant heating in the control circuit (usually in the form of an integrated circuit), which, in the worst case, results in components being destroyed.

SUMMARY OF THE INVENTION

The object of the invention is to provide a circuit for driving a semiconductor switch which overcomes the above-noted deficiencies and disadvantages of the prior art devices and methods of this general kind. Provision should be made for the gradient of the drive signal to be set on the basis of temperature during the changeover from one drive level to the other. The gradient of the drive signal increases, in particular, with rising temperature.

With the above and other objects in view there is provided, in accordance with the invention, a circuit configuration, comprising:
  a semiconductor switch having a control input;
  a driver circuit having an input terminal for receiving a switching signal and an output terminal connected to the control input of the semiconductor switch;
  the output terminal carrying a drive signal based on the switching signal, the drive signal respectively assuming a first drive level and a second drive level, wherein a gradient of the drive signal during a change from the first drive level to the second drive level is temperature-dependent.

If the temperature of the circuit is in a temperature range in which, as a result of the semiconductor switch switching slowly, an additional temperature rise can occur without the risk of destroying the circuit, the gradient of the drive signal is reduced in order to reduce the electromagnetic interference radiation. If the temperature in the circuit configuration rises and there is concern regarding the risk of components being destroyed in the event of a further temperature rise, the gradient of the drive signal increases during a change from one drive level to the other in order to achieve fast switching in the semiconductor switch and, thereby, to limit the switching losses which result in further heating. To protect the components, the invention accepts more intense electromagnetic radiation in order to prevent that the components overheat.

In accordance with an added feature of the invention, the gradient of the drive signal increases with rising temperature.

In accordance with an additional feature of the invention, the driver circuit includes a current source for supplying a temperature-dependent current.

In accordance with a preferred embodiment of the invention, the current source can be selectively connected to the output terminal based on the switching signal.

In other words, the driver circuit has a current source and a current sink for supplying and, respectively, for receiving a temperature-dependent current. The current source and the current sink can thereby be connected to the output terminal on the basis of the switching signal. This embodiment is of particular use when a field-effect transistor is used as the semiconductor switch. The gate electrode, as the control connection of the semiconductor switch, is then connected to the output terminal of the driver circuit. The conductivity of the field-effect transistor is dependent on the charge stored in its gate capacitance and/or on the voltage between its gate electrode and source electrode. If the field-effect transistor is intended to be on, a current flows through the output terminal to its gate capacitance, which causes the gate/source voltage, as the drive signal critical for the field-effect transistor, to rise. The speed of the rise in or the gradient of the drive signal is approximately proportional to the capacitance value of the gate capacitance and to the current flowing to the gate capacitance. If this current rises with rising temperature, the field-effect transistor is turned on more quickly, which reduces the losses during the changeover phase from the off to the on state. If the field-effect transistor is intended to be off, its gate capacitance is discharged with a temperature-dependent current predetermined by the current sink, in which case the discharge, and hence the changeover from the on to the off state, takes place more quickly the higher the current.

In accordance with a further feature of the invention, the driver circuit includes a current source for outputting a temperature-dependent current to the output terminal and a current sink for receiving a temperature-dependent current from the output terminal.

In accordance with again an added feature of the invention, the driver circuit has a first switch for connecting the current source to the output terminal and a second switch for connecting the current sink to the output terminal based on the switching signal.

In accordance with again an additional feature of the invention, the current rises with rising temperature. In a specific feature of the invention, the current rises with rising temperature after a predetermined temperature threshold has been reached.

In accordance with again another feature of the invention, the driver circuit includes a drive unit connected to and driving the first switch and the second switch based on the switching signal, wherein the drive unit has an input receiving the switching signal.

In accordance with still another feature of the invention, there is provided a temperature sensor connected to the current source and to the current sink for setting the current.

In accordance with still a further feature of the invention, the semiconductor switch is a power MOSFET.

In accordance with a concomitant feature of the invention, the first switch and the second switch are each transistors each having a gate connected to and receiving from the drive unit a signal dependent on the switching signal.

The current source and the current sink are in the form of controllable current sources to which a temperature sensor supplies a temperature signal for setting the current.

The driver circuit preferably has only one controlled current source, which can be connected to the output terminal via a first current mirror, as the current source, and via a second current mirror, as the current sink.

Other features which are considered as characteristic for the invention are set forth in the appended claims.

Although the invention is illustrated and described herein as embodied in a circuit configuration for driving a semiconductor switch, it is nevertheless not intended to be limited to the details shown, since various modifications and structural changes may be made therein without departing from the spirit of the invention and within the scope and range of equivalents of the claims.

The construction and method of operation of the invention, however, together with additional objects and advantages thereof will be best understood from the following description of specific embodiments when read in connection with the accompanying drawings.

BRIEF DESCRIPTION OF THE DRAWINGS

FIG. 3 is a time graph showing an illustrative curve for a switching process.

DESCRIPTION OF THE PREFERRED EMBODIMENTS

Figure 1:
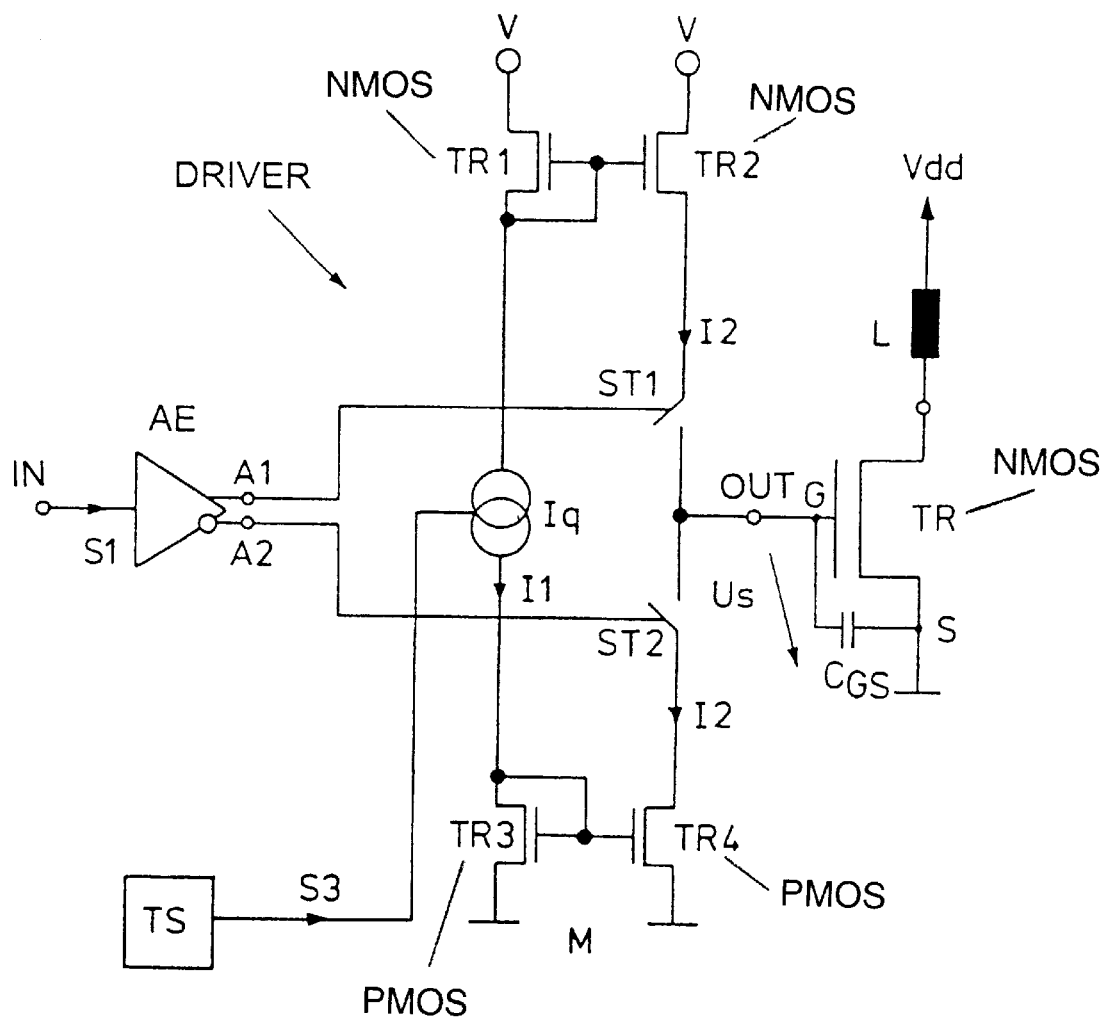
FIG. 1 is a circuit schematic of an exemplary embodiment of the circuit configuration according to the invention.

Referring now to the figures of the drawing in detail and first, particularly, to FIG. 1 thereof, there is seen an exemplary circuit configuration according to the invention with a semiconductor switch TR in the form of a field-effect transistor, particularly in the form of a power MOSFET, and a driver circuit DRIVER. The driver circuit DRIVER is connected to a gate electrode G of the semiconductor switch TR by means of an output terminal OUT. An input terminal IN of the driver circuit DRIVER is supplied with a switching signal. The switching signal is preferably binary and is intended to govern whether the semiconductor switch TR is on or off. FIG. 1 illustrates, by way of example, an inductive load L in series with the load path of the semiconductor switch TR. The inductive load L is connected to a supply potential Vdd.

The conductivity of the semiconductor switch TR is determined by a drive signal Us which is supplied by the driver circuit DRIVER and, in the illustrative embodiment shown, is the voltage between the gate electrode G and the source electrode S of the field-effect transistor TR. The n-conductive MOSFET TR shown turns on when the gate/source voltage exceeds a positive threshold voltage value. The load path resistance then falls as the gate/source voltage rises, until the MOSFET TR is driven at the maximum level, so that the load path resistance cannot be reduced further, and the MOSFET is turned on to the maximum extent. Approximately the entire supply voltage Vdd then drops across the load L.

Ideally, the semiconductor switch TR is operated such that it is on to the maximum extent possible or is off completely, that is to say its load path resistance assumes a maximum value or a minimum value. Accordingly, the drive signal Us in the present example assumes a lower drive level in order to turn off the semiconductor switch, and assumes an upper drive level in order to turn on the semiconductor switch TR.

The duration of a switching process of the semiconductor switch TR is determined by the length of time necessary for the drive signal Us to change over from the lower to the upper drive level, and vice versa. This length of time is determined, on the one hand, by the capacitance value of a gate/source capacitance $C_{GS}$ which is present in field-effect transistors between the gate electrode G and the source electrode S. The capacitance $C_{GS}$ is shown in FIG. 1 for purposes of clarity. On the other hand, the switching time is determined by a current I2 which, for the purpose of recharging the gate/source capacitance $C_{GS}$, flows from the driver circuit DRIVER via the output terminal OUT to the gate electrode G of the semiconductor switch TR, or is received by the gate electrode G from the driver circuit DRIVER via the output terminal OUT. This current I2 is temperature-dependent in the driver circuit shown.

For supplying the current I2, the driver circuit DRIVER has a current sink and a current source which have a common current source Iq. The current source has a current mirror with a first and a second transistor TR1, TR2, and the current sink has a current mirror with a third and a fourth transistor TR3, TR4. In the illustrative embodiment, the first and the second transistor TR1, TR2, whose gate electrodes are connected to one another, are n-conductive field-effect transistors whose source connections are connected to a node for a supply potential V. In the illustrative embodiment, the third and the fourth transistor TR3, TR4, whose gate electrodes are likewise connected to one another, are p-conductive field-effect transistors whose source connections are connected to a node for a reference-ground potential M. The first and the third transistor TR1, TR3 are connected as diodes (their gate electrodes are connected to their drain electrodes). The current source Iq is connected between the source electrodes of the first and the third transistors TR1, TR3.

To connect the current source, which comprises the current source Iq and the current mirror TR1, TR2, to the connection terminal OUT, a first switch ST1 is connected between the source electrode of the second transistor TR2 and the Connection terminal OUT. Similarly, to connect the current sink, which comprises the current source Iq and the current mirror TR3, TR4, to the connection terminal OUT, a second switch ST2 is connected between the source electrode of the third transistor TR3 and the connection terminal OUT. The first and the second switch ST1, ST2 can be driven, on the basis of a switching signal S1, via a drive unit AE which is supplied with the switching signal S1 at an input terminal and has the output terminals A1, A2, to which control connections of the first and second switches are connected. The first and the second switch ST1, ST2 and the drive signals present at the output terminals A1, A2 are preferably tuned to one another such that only one of the two switches ST1; ST2 is on in each case. In the example shown, the drive unit AE is an amplifier with a noninverting output, which is connected to the output terminal A1, and with an inverting output, which is connected to the output terminal A2.

The current source Iq supplies a temperature-dependent current I1. The current is set on the basis of a temperature signal S3 which can be supplied to an input terminal of the current source Iq and is provided by a temperature sensor TS. As an example, the current source Iq is a voltage-controlled current source Iq, and the temperature signal S3 is accordingly a temperature-dependent voltage used for setting the current I1. The temperature signal S3 is preferably constant up to a temperature T0, and then rises linearly with rising temperature. The current I1 illustrated in FIG. 2 results. The current I2 flowing to the output terminal to charge the gate/source capacitance $C_{GS}$ and the current I2 received from the output terminal OUT to discharge the gate/source capacitance $C_{GS}$ are proportional to the current I1. The proportionality factor is given by the current-mirror ratios of the first and second current mirrors TR1–TR2, TR3–TR4, which preferably have the same current-mirror ratios.

The way in which the circuit configuration shown works is explained briefly below.

With the gate/source capacitance $C_{GS}$ initially discharged, the MOSFET TR is off. If the first switch ST1 is turned on, on the basis of the switching signal S1, and the second switch ST2 is turned off, a current I2 flows from the circuit segment that acts as the current source, comprising the first current mirror TR1, TR2 and the current source Iq via the output terminal OUT of the driver circuit to the gate/source capacitance $C_{GS}$. The rise in, or the gradient of, the drive signal Us is then proportional to the current I2, which is dependent on the temperature-dependent current I1 by virtue of the current-mirror ratio of the first current mirror TR1, TR2. If, in the illustrative embodiment, the temperature is above T0, the current I2 rises as the temperature rises further, which means that the gradient of the drive signal Us increases. The MOSFET then changes over more quickly from the off to the on state. Although this amplifies the electromagnetic radiation, it counteracts further heating in the circuit caused by losses on the MOSFET during the switching process. In the illustrative embodiment shown, the drive signal Us rises until it reaches approximately the value of the supply potential V, minus the voltage drop across the load path of the second transistor.

To turn off the MOSFET TR, the second switch ST2 is turned on, on the basis of the switching signal S1, and the first switch ST1 is turned off. The gate/source capacitance $C_{GS}$ is then discharged with a current I2 which is determined by the circuit segment acting as the current sink, comprising the current source Iq and the second current mirror TR3, TR4. The gradient with which the drive signal Us falls is proportional to the current I2, which is dependent on the temperature-dependent current I1 by virtue of the current-mirror ratio of the second current mirror TR3, TR4. If, in the illustrative embodiment, the temperature of the circuit is above T0, the discharging current I2, and hence the gradient of the drive signal Us, rises with rising temperature. The MOSFET TR then changes over more quickly from the on to the off state. Although this amplifies the electromagnetic radiation, it counteracts further heating caused by losses on the MOSFET during the switching process. The drive signal drops until it reaches approximately a value which is given in the example in FIG. 1 by the load path voltage of the fourth transistor TR4. FIG. 3 shows, by way of example, the curve for a switching process for two different temperatures T=T1 and T=T2, where T2>T1. If the switching signal S1 changes from a lower level S1L to an upper level S1H, the drive signal Us rises from a lower drive level UsL to an upper drive level UsH. The gradient of the rise is dependent on the temperature-dependent current I2 flowing to the output terminal OUT. The rise is faster the higher the current I2 or the higher the temperature. When the switching signal changes from the upper drive level S1H to the lower drive level S1L, the drive signal Us falls from the upper drive level to the lower drive level, with the fall being steeper the higher the discharging current I2 or the higher the temperature.

Figure 4:
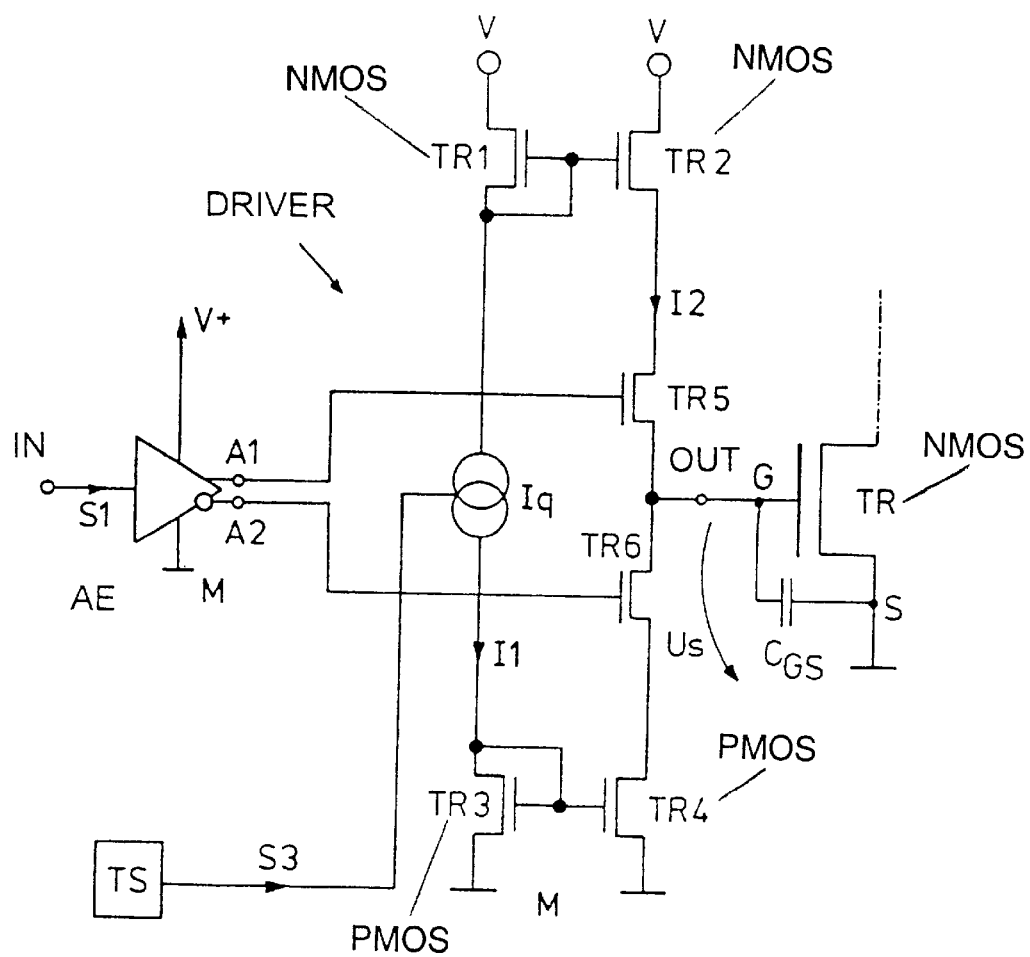
FIG. 4 is a circuit schematic of a further exemplary embodiment of the circuit configuration according to the invention.

FIG. 4 shows an illustrative embodiment of the circuit according to the invention, in which the switches ST1, ST2 are field-effect transistors TR5, TR6 whose gate electrodes are connected to the output terminals A1, A2 of the drive unit AE. The high or low levels present on the output terminals A1, A2, on the basis of the switching signal S1, for driving the field-effect transistors TR5, TR6 are chosen such that the field-effect transistors TR5, TR6 are reliably on or reliably off, irrespective of the drive signal Us. The high level at the output of the drive unit AE is therefore preferably above the value of the supply potential V, and the low level is preferably below the value of the voltage drop across the load path of the fourth transistor TR4.

Figure 2:
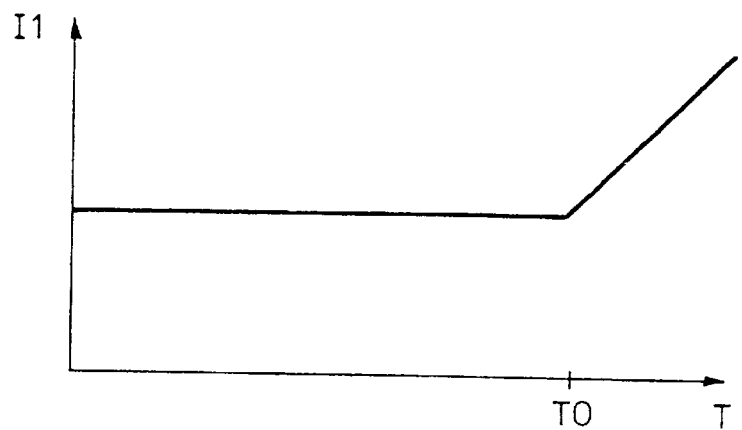
FIG. 2 is a graph illustrating the temperature-dependent curve for the current supplied to the driver circuit by a current source.

Up to a temperature T0, the circuits shown in FIGS. 1 and 2 behave like a conventional circuit configuration for driving a semiconductor switch. The switching speed of the semiconductor switch is reduced to the benefit of reduced electromagnetic radiation, which, however, increases the losses on the semiconductor switch. Above the temperature, the switching speed increases with rising temperature in order to reduce the losses on the semiconductor switch and to prevent further heating in the circuit. It is, of course, also possible for the switching speed to be controlled as a function of temperature over the entire temperature range. The current I1 delivered by the current source Iq would then rise with rising temperature over the entire temperature range.

It is also possible, depending on whether the temperature is above or below the temperature threshold T0, for only two edge gradients to be provided for the drive signal Us, by supplying a current I1 which assumes only two different values.

We claim:

1. A circuit configuration, comprising:
   a semiconductor switch having a control input;
   a driver circuit having an input terminal for receiving a switching signal and an output terminal connected to said control input of said semiconductor switch, said driver circuit including a current source for supplying a temperature-dependent current rising with rising temperature after a predetermined temperature threshold has been reached;
   said output terminal carrying a drive signal based on the switching signal, the drive signal respectively assuming a first drive level and a second drive level, wherein a gradient of the drive signal during a change from the first drive level to the second drive level is temperature-dependent.

2. The circuit configuration according to claim 1, wherein the gradient of the drive signal increases with rising temperature.

3. The circuit configuration according to claim 1, which further comprises a switch for selectively connecting the current source to said output terminal based on the switching signal.

4. The circuit configuration according to claim 1, wherein said driver circuit includes a current source for outputting a temperature-dependent current to said output terminal and a current sink for receiving a temperature-dependent current from the output terminal.

5. The circuit configuration according to claim 4, wherein said driver circuit has a first switch for connecting said current source to said output terminal and a second switch for connecting said current sink to said output terminal based on the switching signal.

6. The circuit configuration according to claim 5, wherein said driver circuit includes a drive unit connected to and driving said first switch and said second switch based on the switching signal, wherein said drive unit has an input receiving the switching signal.

7. The circuit configuration according to claim 4, which further comprises a temperature sensor connected to said current source and to said current sink for setting the current.

8. The circuit configuration according to claim 1, wherein said semiconductor switch is a power MOSFET.

9. The circuit configuration according to claim 5, wherein said first switch and said second switch are each transistors each having a gate connected to and receiving from said drive unit a signal dependent on the switching signal.

10. A circuit configuration, comprising:

a semiconductor switch having a control input;

a driver circuit having an input terminal for receiving a switching signal and an output terminal connected to said control input of said semiconductor switch;

said output terminal carrying a drive signal based on the switching signal, the drive signal respectively assuming a first drive level and a second drive level, wherein a gradient of the drive signal during a change from the first drive level to the second drive level being temperature-dependent and rising with rising temperature after a predetermined temperature threshold has been reached.

11. The circuit configuration according to claim 10, wherein said driver circuit includes a current source for supplying a current, said current being said drive signal.

12. The circuit configuration according to claim 10, which further comprises a switch for selectively connecting the current source to said output terminal based on the switching signal.

13. The circuit configuration according to claim 10, wherein said driver circuit includes a current source for outputting a temperature-dependent current to said output terminal and a current sink for receiving a temperature-dependent current from the output terminal.

14. The circuit configuration according to claim 13, wherein said driver circuit has a first switch for connecting said current source to said output terminal and a second switch for connecting said current sink to said output terminal based on the switching signal.

15. The circuit configuration according to claim 14, wherein said driver circuit includes a drive unit connected to and driving said first switch and said second switch based on the switching signal, wherein said drive unit has an input receiving the switching signal.

16. The circuit configuration according to claim 13, which further comprises a temperature sensor connected to said current source and to said current sink for setting the current.

17. The circuit configuration according to claim 10, wherein said semiconductor switch is a power MOSFET.

18. The circuit configuration according to claim 14, wherein said first switch and said second switch are each transistors each having a gate connected to and receiving from said drive unit a signal dependent on the switching signal.

* * * * *